United States Patent [19]
Schweitzer, Jr.

[11] Patent Number: 4,706,016
[45] Date of Patent: Nov. 10, 1987

[54] SURGE DETECTOR HAVING DISTRIBUTED LINE INDUCTANCE PICKUP

[76] Inventor: Edmund O. Schweitzer, Jr., 2433 Center St., Northbrook, Ill. 60062

[21] Appl. No.: 730,752

[22] Filed: May 3, 1985

[51] Int. Cl.⁴ .................. G01R 19/00; H02H 3/22
[52] U.S. Cl. ............................. 324/102; 324/126; 361/111
[58] Field of Search .......... 324/102, 116, 127, 402, 324/126; 361/120, 126, 127, 110, 111, 113, 93

[56] References Cited

U.S. PATENT DOCUMENTS

| | | | |
|---|---|---|---|
| 720,335 | 2/1903 | Eastman | 324/126 |
| 2,200,233 | 5/1940 | Whitehead | 361/111 |
| 3,882,378 | 5/1975 | Foord | 324/102 |
| 4,186,339 | 1/1980 | Finger | 324/126 |
| 4,271,448 | 6/1981 | Pond | 361/93 |
| 4,375,617 | 3/1983 | Schweitzer, Jr. | 324/127 |

Primary Examiner—Reinhard J. Eisenzopf
Assistant Examiner—Vinh P. Nguyen
Attorney, Agent, or Firm—Lockwood, Alex, FitzGibbon & Cummings

[57] ABSTRACT

A detector for indicating the occurrence of a surge current in the ground return conductor of a lightning arrestor or other monitored conductor includes two clamps which establish electrical connection with the conductor at two spaced locations along its length. A rectifier circuit develops an actuator signal from the voltage induced between the two locations to activate an electromechanical counter or indicator flag. The clamps are installable on the conductor without access to the ends thereof to facilitate installation of the detector on an existing conductor.

18 Claims, 15 Drawing Figures

SURGE DETECTOR HAVING DISTRIBUTED LINE INDUCTANCE PICKUP

BACKGROUND OF THE INVENTION

The present invention is directed generally to surge detectors, and more particularly to a clamp-on surge detector for lightning arrestors which utilizes the distributed inductance of the ground return line of the arrestor to detect surge current.

In electrical power distribution systems it is frequently desirable to know if a discharge has occurred in a particular lightning arrester, since such discharges, if frequent, may damage the arrestor or related power system components.

In the past discharges in lightning arrestors have been detected by means of a varistor serially installed on the ground return lead of the arrestor. Since such varistors were relatively expressive and introduced an increased impedance in the ground return line, and required that the ground return line be disconnected for installation and removal, their use as surge detection elements was not entirely satisfactory. The present invention provides an economical self-powered surge detector which can be installed on the ground return lead of a lightning arrestor without disconnecting the lead, and which does not utilize a current transformer.

Accordingly, it is a general object of the present invention to provide a new and improved surge detector.

It is a more specific object of the present invention to provide a surge detector which is economical to construct and which does not require that the ground return conductor of a lightning arrestor be disconnected during installation of the detector.

It is a further object of the present invention to provide a self-powered surge detector which provides an output indicative of the number of surges which have occurred in a monitored conductor.

SUMMARY OF THE INVENTION

The invention is directed to a surge detector for detecting the occurrence of a surge current in a monitored conductor of the type having along a monitored segment a distributed inductance. The detector comprises first connection means for establishing at a first location on the monitored conductor a first electrical connection, and second connection means for establishing at a second location on the monitored conductor a second electrical connection. The first and second locations are spaced along the monitored segment whereby upon occurrence of a surge current in the monitored conductor a voltage drop is developed between the locations. Indicator means responsive to the voltage between the connection means produce an output indicative of the occurrence of a surge current in the conductor.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference numerals identify like elements, and in which:

DESCRIPTION OF THE PREFERRED EMBODIMENT

Figure 1:
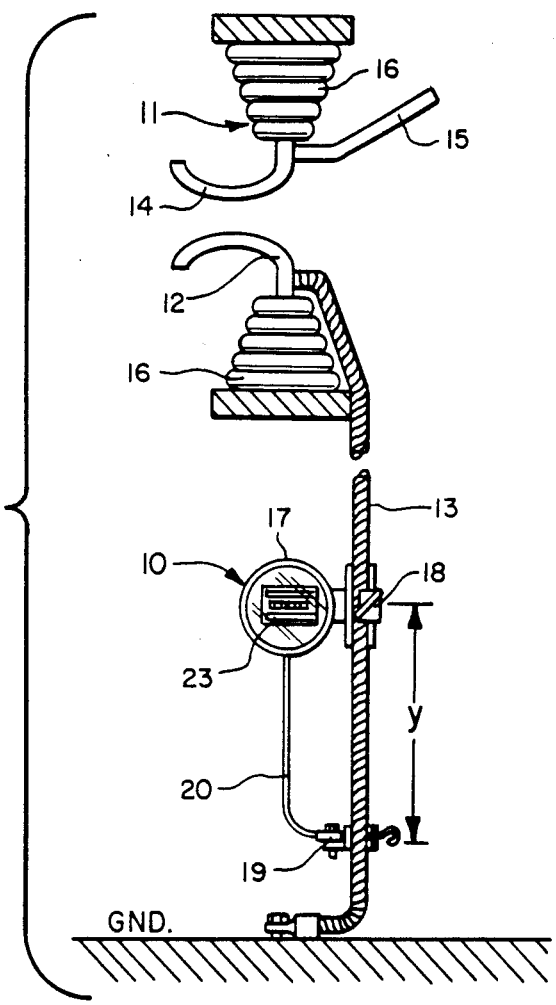
FIG. 1 is a front elevational view of a self-powered clamp-on surge detector constructed in accordance with the invention for displaying a cumulative count of the number of surges which have occurred in the ground return conductor of a conventional lightning arrestor.

Referring to the Figures, and particularly to FIGS. 1-4, a surge detector 10 constructed in accordance with the invention is shown for displaying a cumulative count of the number of surges in a conventional lightning arrestor 11 of the type commonly used in an electrical power distribution system. As shown in FIG. 1, the lightning arrestor 11, in accordance with conventional practice, includes a gap electrode 12 in electrical association with a ground return conductor 13, a gap electrode 14 in electrical association with a protected power line 15, and a pair of stand-off insulators 16. Upon the occurrence of a voltage potential on the protected line 15 which exceeds the breakdown potential between gap electrodes 12 and 14, an arc is established between the gap electrodes which causes the protected conductor to be momentarily shunted to ground through conductor 13, which is typically No. 6 A.G.W., or larger. It is during this period that a surge current occurs through conductor 13 which, if detected, enables the breakdown of the arrestor to be detected.

Referring further to FIG. 1, the surge detector 10 is seen to include an indicator unit 17 having an integral electrically-conductive cable clamp 18, and a remotely positioned electrically conductive cable clamp 19 connected to the indicator unit by a flexible electrical conductor 20. The indicator unit 17 and the remote cable clamp 19 are seen to be mounted with a spacing y along the axis of the ground return conductor 13.

Figure 2:
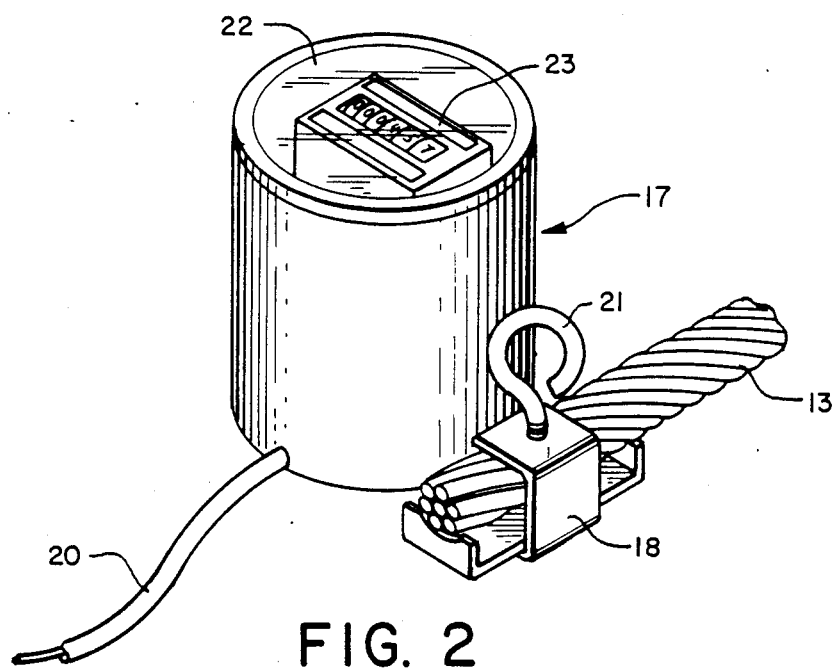
FIG. 2 is an enlarged perspective view of the indicator unit of the surge detector of FIG. 1.
Figure 3:
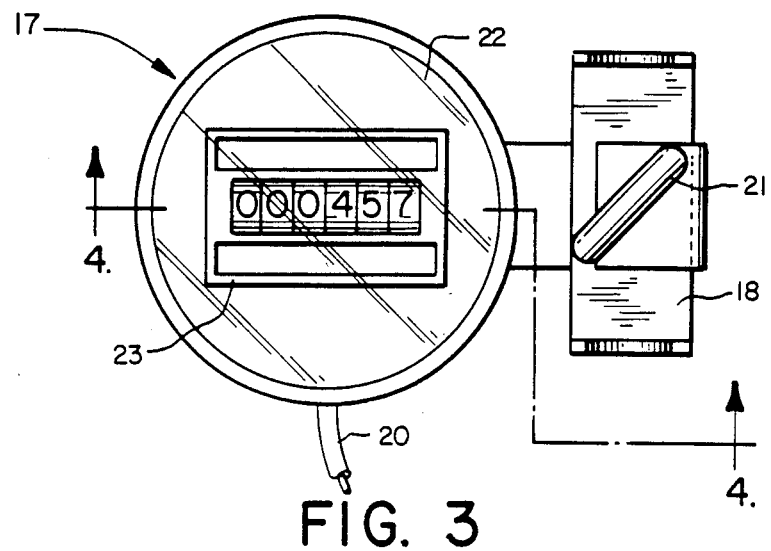
FIG. 3 is an enlarged top plan view of the indicator unit shown in FIG. 2.

Referring to FIG. 2, the indicator unit 17 is seen to be mounted on conductor 13 by means of clamp mechanism 18, which may be integral to unit 17 and which may include a user-turned thumb screw 21 for locking the clamp securely to the conductor. The indicator unit 17 is seen to be generally cylindrical in form and to include at its outwardly facing end a transparent window 22 through which an internal digital counter 23 is visible. In operation counter 23 is advanced with each surge detected in ground return conductor 13, so that the count displayed thereon constitutes a cumulative count of the number of surges which have occurred in the conductor. As most clearly shown in FIG. 3, the counter 23 may be a multi-digit counter (in this case 6 digits) so that a cumulative count can be maintained over a long period of time, the number of surges in a particular period being determined by successive readings of the counter. Alternatively, counter 23 can be of a resettable type counter of possibly fewer digits, whereby the counter is reset after each reading so that the display indicates the cumulative count over a shorter observation period.

Figure 4:
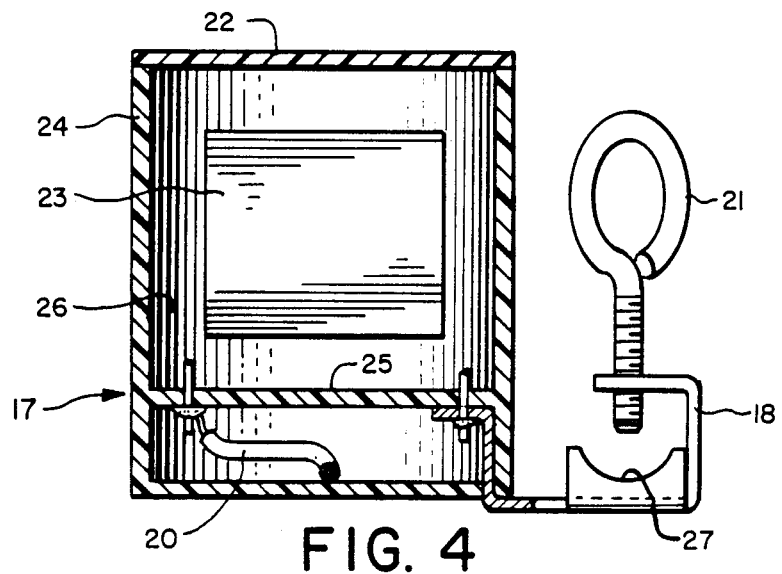
FIG. 4 is a cross-sectional view of the indicator unit taken along line 4—4 of FIG. 3.

Referring to FIG. 4, the indicator head 17 may include a generally cylindrical housing 24 formed of a hard non-breakable plastic material. The housing 24 may include an internal wall 25 to provide for anchoring bracket 20 and to form an internal compartment 26 for receiving counter 23 and other components of the surge detector. A concave recess 27 may be provided on bracket 18 opposite thumb screw 21 to receive conductor 13 when indicator unit 17 is mounted to the conductor. The connecting lead 20 may terminate at the internal wall 25 a shown.

Figure 5:
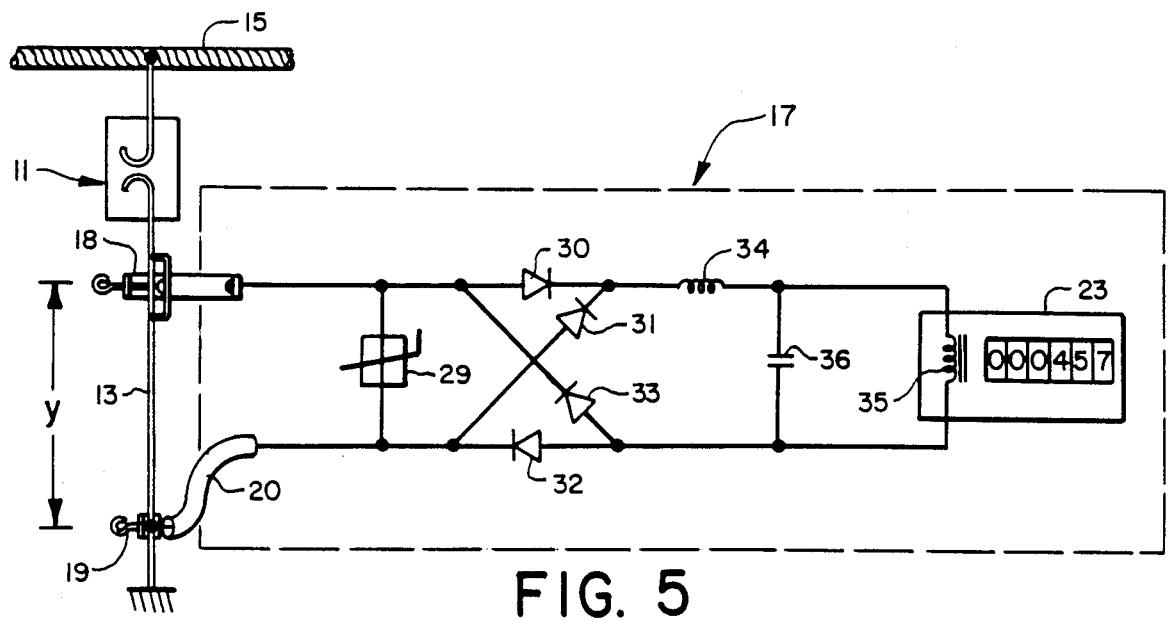
FIG. 5 is an electrical schematic diagram of the surge detector shown in FIGS. 1-4.

Referring to FIG. 5, the metallic mounting bracket 18 is connected to one terminal of a metal oxide varistor (MOV) 29, and to one input terminal of a bridge rectifier network comprising four diodes 30-33. The other input terminal of this rectifier network is connected to the remaining terminal of MOV 29, and to clamp member 19 through flexible conductor 20. One output terminal of the bridge rectifier network is connected through an inductor 34 to one terminal of the actuator solenoid 35 of counter 23 and to one terminal of a capacitor 36. The remaining output terminal of the rectifier network is connected to the remaining terminals of solenoid 35 and capacitor 36.

In operation, upon arcing of lightning arrestor 11 the inherent inductance of the arrestor ground return conductor 19 causes a voltage gradient to develop along the length of the conductor. In practice, this gradient, which is equal to $E = L \, di/dt$, may provide, for example, over a spacing y of 12 inches, a voltage of 100 volts or more for a typical surge current of 100 amperes of 20 microseconds duration.

The voltage drop is applied to the bridge rectifier network provided by diodes 30-33, causing that network to output a DC voltage which charges capacitor 36 through inductor 34. When the charge on capacitor 36 is sufficient to actuate counter 23, the counter increments one unit and a surge is recorded. MOV 29 limits the voltage level applied to the full wave bridge rectifier network to a predetermined maximum level, typically 600 volts, and inductor 34 limits the current through diodes 30-33 so that their forward current rating is not exceeded.

In practice, it has been found for an exemplary spacing y of twelve inches, capacitor 36 may have a value of 2 microfarads and inductor 34 may have a value of 0.2 microhenries. Diodes 30-33 may have a rating of 5 amperes and 1000 volts PIV.

It will be appreciated that with the arrangement of clamp-on indicator unit 17 and clamp-on sensor unit 19 shown in FIGS. 1-5 the surge detector 10 can be readily installed on the ground return conductor of an existing lightning arrestor without disconnecting the conductor. Furthermore, the surge detector can be positioned at any convenient location along the ground return conductor and does not require the insertion of an impedance or other series compartment in the conductor. Moreover the surge detector is simple, economical and compact in construction.

Figure 6:
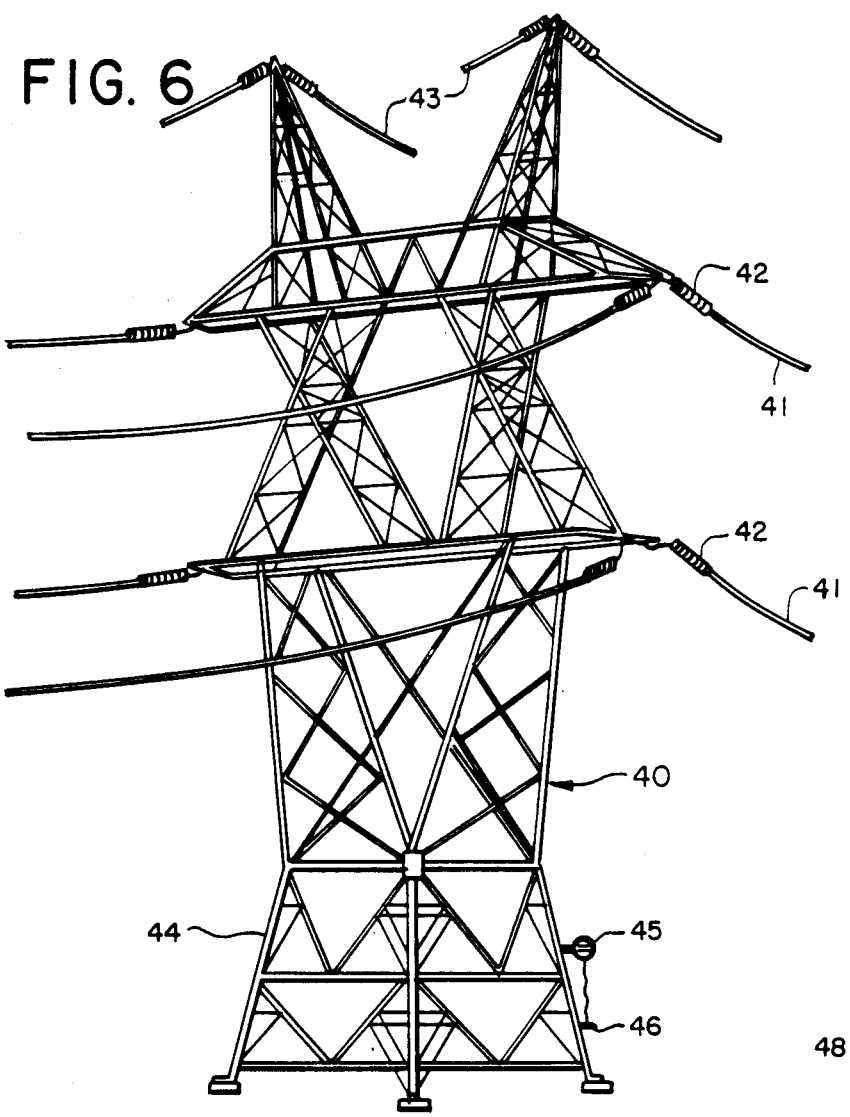
FIG. 6 is a perspective view of a transmission line tower showing a self-powered clamp-on surge detector constructed in accordance with another embodiment of the invention installed on the tower to indicate the occurrence of a surge current therein.
Figure 7:
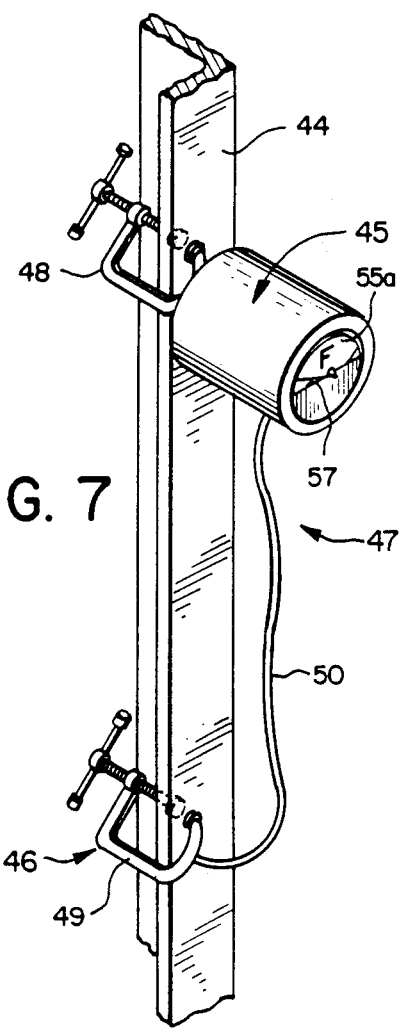
FIG. 7 is an enlarged perspective view of a structural member of the tower showing the surge detector of FIG. 6 mounted thereon.

Referring to FIGS. 6-9, the present invention can be utilized to sense the occurrence of a surge current in the supporting tower of a high voltage power distribution line. As shown in FIG. 6, a supporting tower 40 is shown in conjunction with a high voltage power line comprising a plurality of suspended conductors 41 insulated from the supporting structure 40 by a plurality of insulators 42. A pair of ground potential lines 43 may be provided at the top of the tower in accordance with conventional practice. The supporting tower 40 may include a plurality of individual frame members 44 to which the indicator unit 45 and pickup unit 46 of a self-powered clamp-on surge detector 47 (FIG. 7) can be readily mounted. The indicator unit 45 and pickup unit 46 are preferably provided with screw operated clamp mechanisms 48 and 49, respectively, for attachment to the mounting member 43. A flexible cable 50 connects the indicator unit 45 with the pickup unit 46.

Surge indicator unit 45 differs from indicator unit 17 in that, instead of a cumulative count of the number of surges having occurred, a visible indication is given of the occurrence of a surge. To provide this indication upon the occurrence of a surge current in support member 44 (or in a monitored conductor, where indicator unit 45 and pickup unit 46 are clamped on a conventional conductor as in the embodiment of FIGS. 1-5), surge detector 47 includes within the lower end of the cylindrical housing 51 of indicator unit 46 a disc-shaped target member 55 which is mounted for rotation on a pivot 56. The face of the target disc 55 has a red segment 55a and a white segment 55b, only one of which is visible at a time through a transparent window 57 provided at the end of housing 51.

Figure 10A:
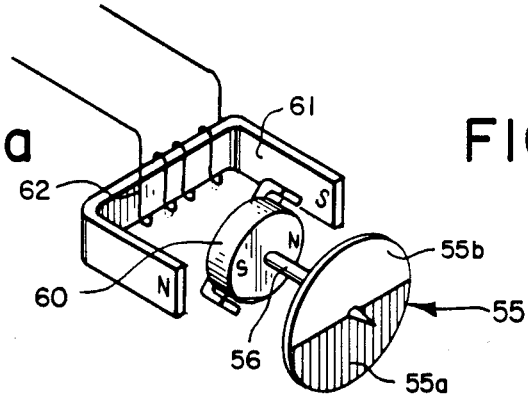
FIGS. 10a and 10b are diagrammatic views of the principal components of the surge detector showing the detector in a reset state.
Figure 10B:
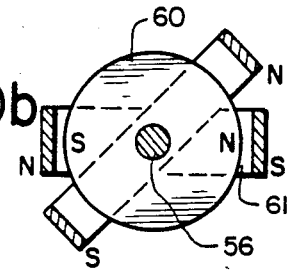
Figure 11A:
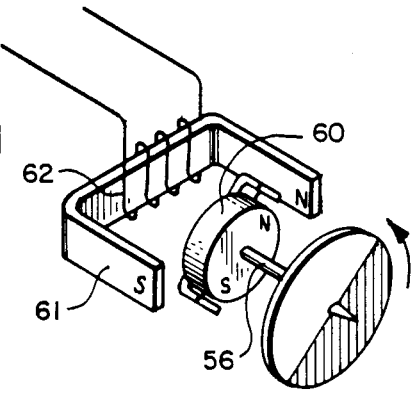
FIGS. 11a and 11b are diagrammatic views similar to FIGS. 10a and 10b, respectively, showing the surge detector in transition between a reset state and a tripped state.
Figure 11B:
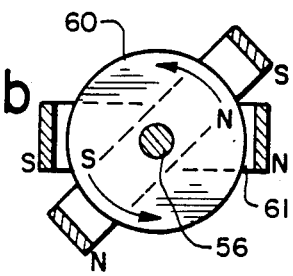

Secured to and pivotable with target 55 is a target permanent magnet 60 which is formed of a magnetic material having a high coersive force, such as ceramic, and is magnetically polarized to form two magnetic poles of opposite gender, as indicated in FIGS. 10-12, with opposite magnetic polarities along a diameter of the magnet. The target disc 55 and its permanent magnet 60 are biased to the position shown in FIGS. 10a and 10b when the surge detector is in a non-tripped or reset condition by means of a stationary generally U-shaped magnetic pole piece 61 which is located within housing 51 generally co-planar with the axis of rotation of target disc 55.

Figure 8:
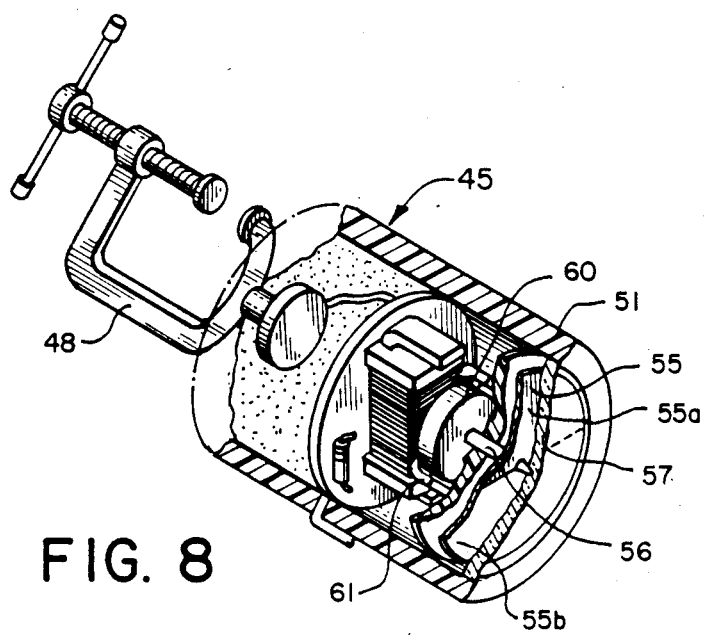
FIG. 8 is an enlarged perspective view of the indicator unit of the surge detector of FIGS. 6 and 7, partially broken away to show the principal components thereof.

The pole piece 61, which is preferably formed of a magnetic material having a relatively low coersive force, such as chrome steel, is biased at its projecting ends to the magnetic polarities indicated in FIGS. 10a and 10b. As shown in FIG. 8, the ends of the pole piece extend along the side wall of housing 51, in close proximity to target magnet 60. As a result, the opposite polarity magnetic poles of the target magnet 60 are attracted to position the target disc 55 as shown. In this position the red segment 55a of the target disc is not visible through window 57, and all that is seen is the white segment 55b.

Figure 12A:
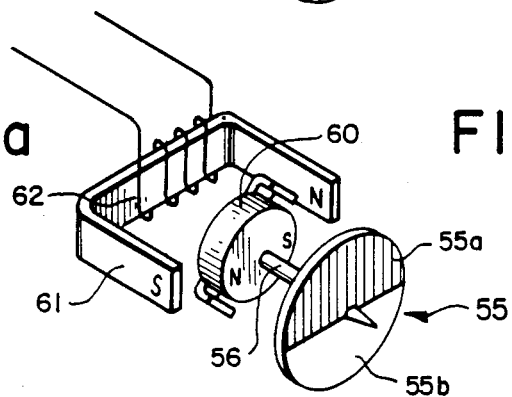
FIGS. 12a and 12b are diagrammatic views similar to FIGS. 10a and 10b, respectively, showing the surge detector in a tripped state.
Figure 12B:
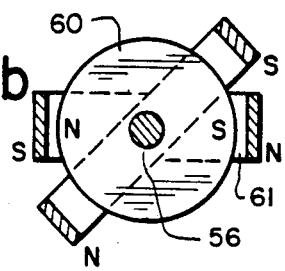

On the occurrence of a surge current in a tower member 44, which may, for example, exceed 1000 amperes, pole piece 61 is remagnetized to the magnet polarities shown in FIGS. 11 and 12 by momentary energization of a trip winding 62 on the center section of the pole piece. As a result, the poles of magnet 60 are repelled by the adjacent-like gender poles of the pole piece and the target disc is caused to rotate 180° to the tripped position shown in FIGS. 12a and 12b. In this position, the red segment 55b of the target disc is visible through window 57, and a lineman viewing the surge detector is advised that a surge current has flowed through tower 40.

The target disc 55 remains in the fault indicating position until the ends of pole piece 61 are subsequently re-magnetized to the magnetic polarities shown in FIGS. 10a and 10b. In practice, this may be accomplished by the lineman by momentary application of an appropriate magnetic field to indicator unit 45 such that pole piece 61 is remagnetized. Once thus reset, the surge detector is conditioned to respond to a subsequent surge current.

Figure 9:
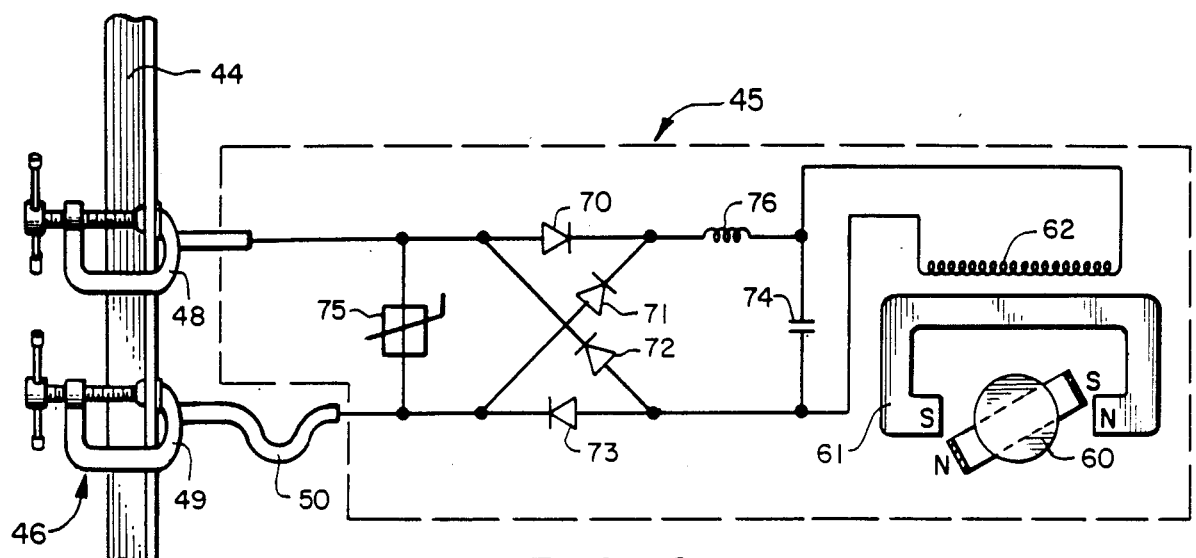
FIG. 9 is an electrical schematic diagram of the surge detector shown in FIGS. 6-8.

Energization of winding 62 upon occurrence of a surge current is accomplished by means of circuitry contained within indicator unit 45. Referring to FIG. 9, this circuitry is seen to be identical to that provided to drive counter 23 in the embodiment of FIGS. 1–5, except that the counter actuator solenoid 35 is replaced by the trip winding 62 of pole piece 61. Within indicator unit 45 four diodes 70–73 provide a full wave bridge rectifier network for developing from the voltage induced in support member (or altenatively a monitored conductor) a DC current for application to a capacitor 74. Upon occurrence of a surge current, when the voltage across capacitor 74 reaches a level sufficient to remagnetize pole piece 61 indicator flag 55 is caused to rotate to the position shown in FIGS. 12a and 12b. An MOV 75 is provided to limit the voltage level applied to diodes 70–73, and a conductor 76 is provided to prevent the application of transients to winding 62 and capacitor 74.

It will be appreciated that the indicator flag arrangement for indicating the occurrence of a surge current embodied in indicator unit 45 can be substituted for the surge counter arrangement embodied in indicator unit 17. Similarly, the counter arrangement of indicator unit 17 can be substituted for the indicator flag arrangement of indicator unit 45. Moreover, while the surge detector of the invention has been shown in conjunction with lightning detection applications, it can be utilized in other applications where high surge currents are to be detected, such as when locating intermittent short circuit conditions.

While a particular embodiment of the invention has been shown and described, it will be obvious to those skilled in the art that changes and modifications may be made therein without departing from the invention in its broader aspects, and, therefore, the aim in the appended claims is to cover all such changes and modifications as fall within the true spirit and scope of the invention.

I claim:

1. A surge detector for detecting the occurrence of a surge current in a monitored conductor having a distributed inductance along the length thereof and subject to the occurrence of a surge current therein, said detector comprising:
    first connection means for establishing at a first predetermined location along the monitored conductor a first electrical connection;
    second connection means for establishing at a second predetermined location along the monitored conductor a second electrical connection;
    said first and second predetermined locations being axially spaced along said monitored conductor whereby an inductive reactance is formed therebetween relative to said surge current as a consequence of the distributed inductance of the conductor;
    charge storage means comprising a capacitor;
    rectifier means comprising at least one diode;
    said diode being serially connected with said capacitor between said first and second connection means to provide a capacitively reactive shunt between said locations relative to the surge current whereby a charge is developed in said capacitor upon occurrence of the surge; and
    indicator means connected across said capacitor and operable from the charge developed therein for producing an output indicative of the occurrence of the surge current.

2. A surge detector as defined in claim 1 wherein said first and second connection means each comprises a clamp member electrically and mechanically removably engaged to said monitored conductor.

3. A surge detector as defined in claim 2 including a housing for said indicator means, said first connection means being attached to said housing, and said second connection means being disposed externally to said housing and electrically connected to said indicator circuit means by a flexible cable.

4. A surge detector as defined in claim 2 wherein said first and second clamp members are adapted for installation on the conductor without access to the ends thereof.

5. A surge detector as defined in claim 1 wherein said indicator means comprise an electro-mechanical counter.

6. A surge detector as defined in claim 1 wherein said indicator means comprise a bi-stable indicating element.

7. A surge detector as defined in claim 1 including a varistor voltate-limiting device connected between said first and second connection means to limit the voltage developed across said capacitor.

8. A surge detector for detecting the occurrence of a surge current in a monitored conductor having a distributed inductance along the length thereof and subject to the occurrence of a surge current therein, said detector comprising:
    first connection means for establishing at a first predetermined location along the monitored conductor a first electrical connection;
    second connection means for establishing at a second predetermined location along the monitored conductor a second electrical connection;
    said first and second predetermined locations being axially spaced along said monitored conductor whereby upon occurrence of the surface current in the conductor an inductive-reactive sensing voltage is developed between said locations as a consequence of the distributed inductance therebetween;
    charge storage means comprising a capacitor;

rectifier means comprising a rectifier network having first and second input terminals and first and second outupt terminals;

said first and second input terminals being connected to said first and second connection means, respectively, and said first and second output terminals being connected to respective terminals of said capacitor to provide a capacitively reactive shunt between said locations relative to the surge current whereby a charge is developed in said capacitor upon occurrence of the surge; and indicator means connected across said capacitor and operable from the charge developed therein for producing an output indicative of the occurrence of the surge current.

9. A surge detector as defined in claim 8 wherein said indicator means comprise a counter responsive to said sensing voltage.

10. A surge detector as defined in claim 8 wherein said indicator means comprise a bi-stable indicating element.

11. A surge detector as defined in claim 8 including a varistor voltage-limiting device connected across the input terminals of said rectifier network for limiting the voltage amplitude of said sensing voltage as applied thereto.

12. A surge detecting system for detecting the occurrence of a surge current, comprising:

a monitored conductor having a continuous unbroken ground connection and a distributed inductance along the length thereof, and subject to the occurrence of a surge current therein;

first connection means for establishing at a first predetermined location along said monitored conductor a first electrical connection;

second connection means for establishing at a second predetermined location along said monitored conductor a second electrical connection;

said first and second predetermined locations being axially spaced along said monitored conductor whereby an inductive reactance is formed therebetween relative to said surge current as a consequence of the distributed inductance of said conductor;

charge storage means comprising a capacitor;

rectifier means comprising at least one diode;

said diode being serially connected with said capacitor between said first and second connection means to provide a capacitively reactive shunt between said locations relative to said surge current whereby a charge is developed in said capacitor upon occurrence of the surge; and indicator means connected across said capacitor and operable from the charge developed therein for producing an output indicative of the occurrence of the surge current in said monitored conductor.

13. A surge detecting system as defined in claim 12 wherein said first and second connection means each comprises a clamp member electrically and mechanically removably engaged to said monitored conductor.

14. A surge detecting system as defined in claim 13 including a housing for said indicator means, said first connection means being attached to said housing, and said second connection means being disposed externally to said housing and electrically connected to said indicator circuit means by a flexible cable.

15. A surge detecting system as defined in claim 13 wherein said first and second clamp members are adapted for installation on the conductor without access to the ends thereof.

16. A surge detecting system as defined in claim 12 wherein said indicator means comprise an electromechanical counter.

17. A surge detecting system as defined in claim 12 wherein said indicator means comprise a bi-stable indicating element.

18. A surge detecting system as defined in claim 12 including a varistor voltage-limiting device connected between said first and second connection means to limit the voltage developed across said capacitor.

* * * * *